United States Patent
Yamamoto et al.

(10) Patent No.: US 8,431,820 B2
(45) Date of Patent: Apr. 30, 2013

(54) HERMETIC SEALING CAP

(75) Inventors: Masaharu Yamamoto, Minamikawachi-gun (JP); Junji Hira, Izumi (JP)

(73) Assignee: Neomax Materials Co., Ltd., Suita-shi (JP)

( * ) Notice: Subject to any disclaimer, the term of this patent is extended or adjusted under 35 U.S.C. 154(b) by 296 days.

(21) Appl. No.: 12/990,719

(22) PCT Filed: Jan. 30, 2009

(86) PCT No.: PCT/JP2009/051542
§ 371 (c)(1),
(2), (4) Date: Nov. 2, 2010

(87) PCT Pub. No.: WO2009/133717
PCT Pub. Date: Nov. 5, 2009

(65) Prior Publication Data
US 2011/0048757 A1 Mar. 3, 2011

(30) Foreign Application Priority Data
May 2, 2008 (JP) .................. 2008-120300

(51) Int. Cl.
*H05K 5/06* (2006.01)
(52) U.S. Cl.
USPC .... 174/50.5; 174/520; 174/50.51; 174/50.52; 257/678; 257/704
(58) Field of Classification Search ............ 174/520, 174/50.5, 50.51, 50.52, 521, 535, 539, 559, 174/66, 67; 257/678, 685, 729, 704, 710, 257/E23.18–E23.193; 427/125, 126.1; 438/124–127, 106
See application file for complete search history.

(56) References Cited

U.S. PATENT DOCUMENTS

| | | | | |
|---|---|---|---|---|
| 4,882,212 A | * | 11/1989 | SinghDeo et al. | 257/E23.193 |
| 4,888,449 A | * | 12/1989 | Crane et al. | 257/E23.193 |
| 5,837,935 A | * | 11/1998 | Carper et al. | 174/50.51 |
| 6,740,959 B2 | | 5/2004 | Alcoe et al. | |
| 7,065,867 B2 | * | 6/2006 | Kim et al. | 257/E23.193 |
| 7,173,331 B2 | * | 2/2007 | Matsubara et al. | 257/E23.18 |
| 7,692,292 B2 | | 4/2010 | Higashi et al. | |
| 7,790,988 B2 | * | 9/2010 | Tanaka et al. | 257/704 |
| 2008/0271908 A1 | | 11/2008 | Yamamoto et al. | |

FOREIGN PATENT DOCUMENTS

| | | |
|---|---|---|
| CN | 1539167 A | 10/2004 |
| CN | 1842912 A | 10/2006 |
| CN | 1890801 A | 1/2007 |
| JP | 8-264675 A | 10/1996 |
| JP | 11-026624 A | 1/1999 |

(Continued)

OTHER PUBLICATIONS

International Search Report of PCT/JP2009/051542, mailing date Feb. 24, 2009.
Chinese Office Action dated Jan. 30, 2012, issued in corresponding Chinese Patent Application No. 200980115687.0.

*Primary Examiner* — Angel R Estrada
(74) *Attorney, Agent, or Firm* — Westerman, Hattori, Daniels & Adrian, LLP

(57) ABSTRACT

A more thinnable hermetic sealing cap can be provided. This hermetic sealing cap (10) is employed for an electronic component housing package (100) housing an electronic component (40) and includes a cap body portion (1) mainly composed of Ti.

15 Claims, 4 Drawing Sheets

FOREIGN PATENT DOCUMENTS

| | | |
|---|---|---|
| JP | 2006-128183 A | 5/2006 |
| JP | 2007-165494 A | 6/2007 |
| JP | 2007-165495 A | 6/2007 |
| JP | 2007-165496 A | 6/2007 |

* cited by examiner

FIG.6

| | ELECTROLYTIC Ni STRIKE PLATING THICKNESS t3 (μm) | ELECTROLESS Ni-P STRIKE PLATING THICKNESS t2 (μm) | COMPOSITION OF SOLDER | SOLDER THICKNESS t4 (μm) | EVALUATION (N) OF ADHESIVENESS | EVALUATION OF INFLUENCE BY MAGNETISM | EVALUATION OF AIRTIGHTNESS | EVALUATION OF HEAT RESISTANCE |
|---|---|---|---|---|---|---|---|---|
| EXAMPLE 1 | NONE | 1.5 (1.0~2.0) | Sn-10Sb | 75 (65~85) | △ (19) | ○ | ○ | ○ |
| EXAMPLE 2 | 0.1 (0.01~0.3) | 1.5 (1.0~2.0) | Sn-10Sb | 75 (65~85) | ○ (29) | ○ | ○ | ○ |
| EXAMPLE 3 | 0.5 (0.37~0.54) | 1.5 (1.0~2.0) | Sn-10Sb | 75 (65~85) | ○ (29) | △ | ○ | ○ |
| EXAMPLE 4 | 0.1 (0.01~0.3) | 1.5 (1.0~2.0) | Sn-10Sb | 50 (40~60) | ○ (29) | ○ | △ | ○ |
| EXAMPLE 5 | 0.1 (0.01~0.3) | 1.5 (1.0~2.0) | Sn-10Sb | 100 (90~110) | ○ (29) | ○ | ○ | ○ |
| EXAMPLE 6 | 0.1 (0.01~0.3) | 1.5 (1.0~2.0) | Sn-5Sb | 75 (65~85) | ○ (29) | ○ | ○ | △ |

HERMETIC SEALING CAP

TECHNICAL FIELD

The present invention relates to a hermetic sealing cap, and more particularly, it relates to a hermetic sealing cap employed for an electronic component housing package housing an electronic component.

BACKGROUND ART

A hermetic sealing cap employed for an electronic component housing package housing an electronic component is known in general. Such a hermetic sealing cap is disclosed in Japanese Patent Laying-Open No. 8-264675, for example.

In the aforementioned Japanese Patent Laying-Open No. 8-264675, a lid (hermetic sealing cap) of ceramics employed for a package housing a semiconductor device (electronic component) is disclosed. This lid of ceramics is formed with a thickness exceeding 0.7 mm in order to ensure prescribed mechanical strength.

Following thinning of an electronic component built in a portable telephone or the like to which thinning is required, a hermetic sealing cap of an electronic component housing package housing the electronic component has been also desired to be thinned in recent years.

However, the lid (hermetic sealing cap) of ceramics described in the aforementioned Japanese Patent Laying-Open No. 8-264675 must be set to the thickness of at least 0.7 mm in order to ensure the prescribed mechanical strength, and hence there is such a problem that the lid cannot be sufficiently thinned.

DISCLOSURE OF THE INVENTION

The present invention has been proposed in order to solve the aforementioned problem, and an object of the present invention is to provide a more thinnable hermetic sealing cap.

A hermetic sealing cap according to an aspect of the present invention is employed for an electronic component housing package housing an electronic component, and includes a cap body portion mainly composed of Ti.

In the hermetic sealing cap according to this aspect, as hereinabove described, the cap body portion mainly composed of Ti is so provided that, since the mechanical strength of Ti is larger than the mechanical strength of ceramics, the thickness of the cap body portion can be reduced as compared with a case of providing a cap body portion mainly composed of ceramics. Consequently, the hermetic sealing cap can be more thinned. When employing the more thinned hermetic sealing cap, further, the electronic component housing package can be more thinned.

The hermetic sealing cap according to the aforementioned aspect preferably further includes a nonmagnetic first plating layer provided to cover the cap body portion. According to this structure, both of the cap body portion mainly composed of Ti and the first plating layer provided to cover the cap body portion are nonmagnetic, whereby a hermetic sealing cap nonmagnetic as a whole can be obtained. Thus, the nonmagnetic hermetic sealing cap according to the present invention can be easily employed also for an electronic component such as a magnetic sensor.

In this case, the first plating layer is preferably an Ni-based plating layer containing P, and the content of P in the Ni-based plating layer is preferably at least 8 mass % and not more than 20 mass %. According to this structure, the nonmagnetic first plating layer can be easily obtained.

In the aforementioned structure in which the first plating layer is the Ni-based plating layer containing P, the content of P in the Ni-based plating layer is preferably at least 8 mass % and not more than 15 mass %. According to this structure, excellent wettability of a solder layer can be ensured in a case of providing the solder layer on the surface of the first plating layer. In this case, the content of P in the Ni-based plating layer is more preferably at least 11 mass % and not more than 13 mass %.

In the aforementioned structure including the first plating layer, the first plating layer preferably has a thickness of at least 1 µm and not more than 2 µm. When employing the first plating layer having the small thickness of not more than 2 µm in this manner, the cap body portion can be inhibited from corrosion while suppressing increase in the thickness of the hermetic sealing cap.

In the aforementioned structure including the first plating layer, the first plating layer is preferably an electroless Ni-based plating layer. According to this structure, the cap body portion can be further inhibited from corrosion, due to the electroless Ni-based plating layer excellent in corrosion resistance.

In the aforementioned structure in which the first plating layer is an electroless Ni-based plating layer, the first plating layer is preferably an electroless Ni—P plating layer. According to this structure, a nonmagnetic first plating layer excellent in corrosion resistance can be obtained, whereby the cap body portion can be inhibited from corrosion while keeping non-magnetism in the hermetic sealing cap as a whole.

In the aforementioned structure including the first plating layer, the hermetic sealing cap preferably further includes a second plating layer arranged between the cap body portion and the first plating layer for increasing adhesiveness. According to this structure, the first plating layer can be inhibited from separating from the cap body portion, due to the second plating layer.

In the aforementioned structure including the second plating layer, the second plating layer is preferably an Ni-based strike plating layer. When employing an Ni-based strike plating layer as the second plating layer in this manner, the adhesiveness between the first plating layer and the cap body portion can be easily increased, whereby the first plating layer can be easily inhibited from separating from the cap body portion.

In the aforementioned structure including the second plating layer, the second plating layer preferably has a thickness smaller than the thickness of the first plating layer. When employing the second plating layer having the small thickness in this manner, the first plating layer can be inhibited from separating from the cap body portion while suppressing increase in the thickness of the hermetic sealing cap.

In the aforementioned structure in which the thickness of the second plating layer is smaller than the thickness of the first plating layer, the second plating layer preferably has a thickness of at least 0.01 µm and not more than 0.3 µm. When forming the second plating layer with the small thickness of at least 0.01 µm and not more than 0.3 µm in this manner, the hermetic sealing cap can be substantially prevented from being influenced by the magnetism of the second plating layer as a whole, whereby the first plating layer can be inhibited from separating from the cap body portion due to the second plating layer while keeping non-magnetism in the hermetic sealing cap as a whole.

In the aforementioned structure including the second plating layer, the second plating layer is preferably an electrolytic N-based strike plating layer. When employing an electrolytic N-based strike plating layer excellent in adhesiveness as the second plating layer in this manner, the first plating layer can be easily inhibited from separating from the cap body portion.

The hermetic sealing cap according to the aforementioned aspect is preferably mounted on an electronic component housing member for housing the electronic component with a solder layer mainly composed of an Sn-based alloy. According to this structure, the hermetic sealing cap can be easily mounted on the electronic component housing member by employing the Sn-based alloy solder layer which is a simple bonding material.

In this case, the solder layer in a state before the hermetic sealing cap is mounted on the electronic component housing member preferably has a thickness of at least 65 μm. According to this structure, excellent airtightness can be ensured in the electronic component housing package. This effect has already been verified by experimental results described later.

In the aforementioned structure in which the solder layer has the thickness of at least 65 μm, the solder layer in the state before the hermetic sealing cap is mounted on the electronic component housing member preferably has a thickness of at least 65 μm and not more than 110 μm. According to this structure, excellent airtightness can be ensured in the electronic component housing package, while increase in the thickness of the electronic component housing package can be suppressed.

In the aforementioned structure provided with the solder layer, the solder layer mainly composed of the Sn-based alloy preferably contains at least 5 mass % and not more than 10 mass % of Sb. According to this structure, excellent heat resistance can be obtained as the solder layer for mounting the hermetic sealing cap on the electronic component housing member.

The hermetic sealing cap according to the aforementioned aspect is preferably mounted on an electronic component housing member made of ceramics for housing the electronic component. According to this structure, the thermal expansion coefficient (about $7 \times 10^{-6}$/K) of the electronic component housing member made of alumina which is a kind of ceramics, for example, and the thermal expansion coefficient (about $9 \times 10^{-6}$/K) of the hermetic sealing cap made of Ti can be approximated to each other, whereby the electronic component housing member and the hermetic sealing cap can be expanded or contracted with substantially similar rates of changes when the temperature fluctuates. Thus, stress caused in the electronic component housing package can be reduced when the temperature fluctuates, whereby the electronic component housing package can be inhibited from cracking resulting from the stress.

BRIEF DESCRIPTION OF THE DRAWINGS

[FIG. 6] A diagram showing experimental results of experiments having confirmed the performance of the hermetic sealing cap according to the embodiment of the present invention.

BEST MODES FOR CARRYING OUT THE INVENTION

An embodiment embodying the present invention is now described with reference to the drawings.

First, the structure of a hermetic sealing cap 10 according to the embodiment of the present invention is described with reference to FIGS. 1 to 3.

Figure 1:
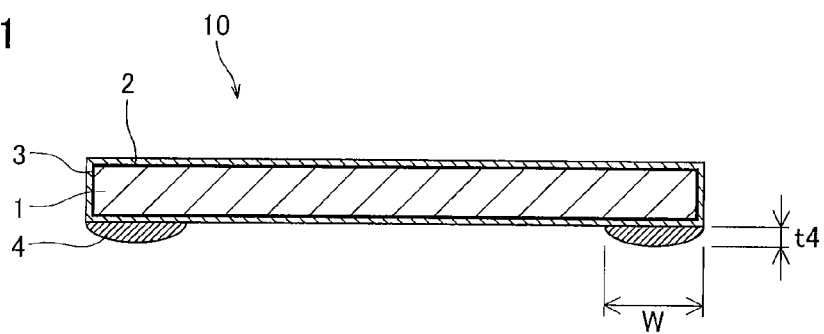
[FIG. 1] A sectional view showing a hermetic sealing cap according to an embodiment of the present invention.

The hermetic sealing cap 10 according to this embodiment includes a cap body portion 1, an electroless Ni—P plating layer 2 formed to substantially cover the whole of the cap body portion 1 and an electrolytic Ni strike plating layer 3 arranged between the cap body portion 1 and the electroless Ni—P plating layer 2, as shown in FIG. 1. The electroless Ni—P plating layer 2 is an example of the "first plating layer" in the present invention, and the electrolytic Ni strike plating layer 3 is an example of the "second plating layer" in the present invention.

Figure 2:
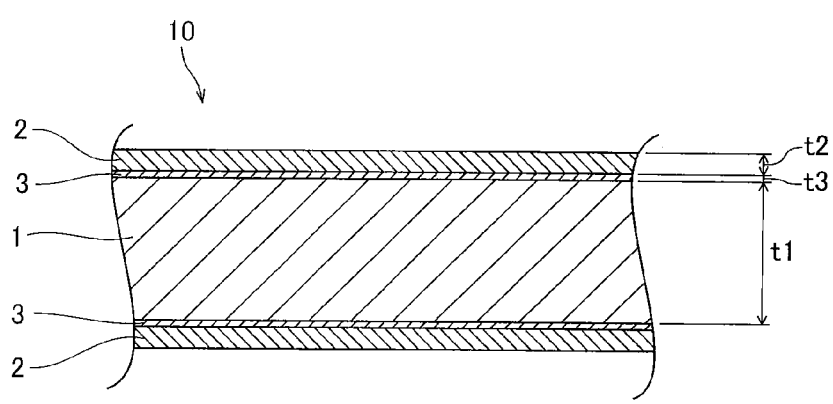
[FIG. 2] An enlarged sectional view showing the hermetic sealing cap according to the embodiment of the present invention.
Figure 3:
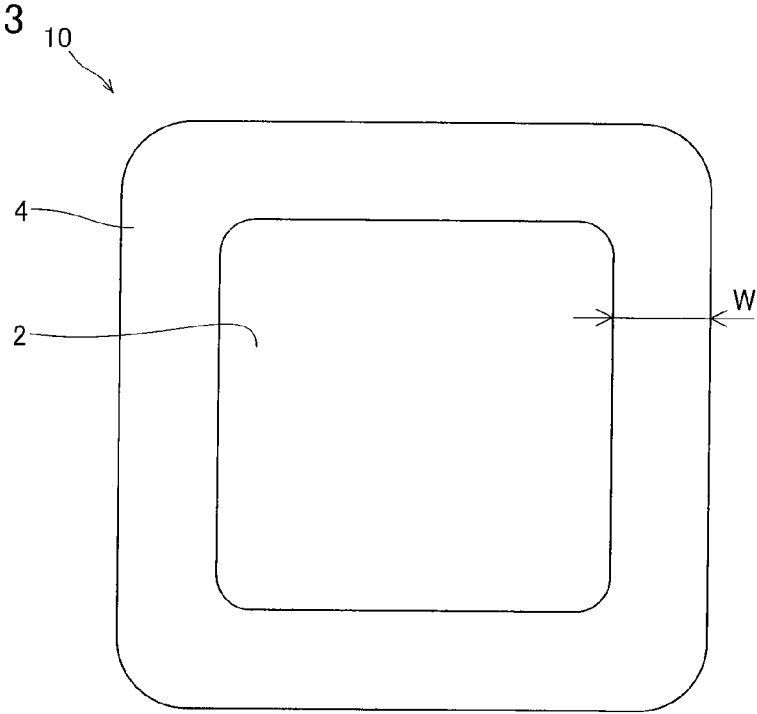
[FIG. 3] A bottom plan view of the hermetic sealing cap according to the embodiment of the present invention as viewed from the lower side.

According to this embodiment, the cap body portion 1 is made of Ti which is nonmagnetic, and has a thickness t1 of about 0.1 mm, as shown in FIG. 2. Further, the cap body portion 1 is provided substantially in the form of a square having respective sides of about 4.3 mm in length in plan view, as shown in FIG. 3. The thermal expansion coefficient (about $9 \times 10^{-6}$/K) of the cap body portion 1 made of Ti is approximate to the thermal expansion coefficient (about $7 \times 10^{-6}$/K) of an electronic component housing member 20 made of alumina described later.

The electroless Ni—P plating layer 2 is provided for inhibiting the cap body portion 1 from corrosion. Further, the electroless Ni—P plating layer 2 is formed to be nonmagnetic by containing at least about 8 mass % and not more than about 20 mass % of P (phosphorus). In order to ensure excellent wettability of a solder layer 4 described later, the content of P in the electroless Ni—P plating layer 2 is preferably set to not more than about 15 mass % As shown in FIG. 2, the electroless Ni—P plating layer 2 has a thickness t2 of at least about 1.0 μm and not more than about 2.0 μm. The electroless Ni—P plating layer 2 may have a thickness of about 1 μm, in order to ensure corrosion resistance.

The electrolytic Ni strike plating layer 3 as the underlayer for the electroless Ni—P plating layer 2 is provided for increasing adhesiveness between the cap body portion 1 and the electroless Ni—P plating layer 2. Further, the electrolytic Ni strike plating layer 3 has a thickness t3 of not more than about 0.6 μm smaller than the thickness t2 (at least about 1.0 μm and not more than about 2.0 μm) of the electroless Ni—P plating layer 2.

As shown in FIG. 1, the solder layer 4 is provided on the lower surface of the hermetic sealing cap 10. The solder layer 4 is formed in the vicinity of the outer periphery of the lower surface of the hermetic sealing cap 10 in a peripheral manner with a width W of about 0.9 mm and a thickness t4 of at least about 40 μm in plan view, as shown in FIGS. 1 and 3. More specifically, the solder layer 4 is formed on a portion corresponding to an Au layer 25 of the electronic component housing member 20 when sealing the electronic component housing member 20 (see FIG. 4) described later. The solder layer 4 is constituted of an SN-based alloy containing at least about 5 mass % and not more than about 10 mass % of Sb.

Figure 4:
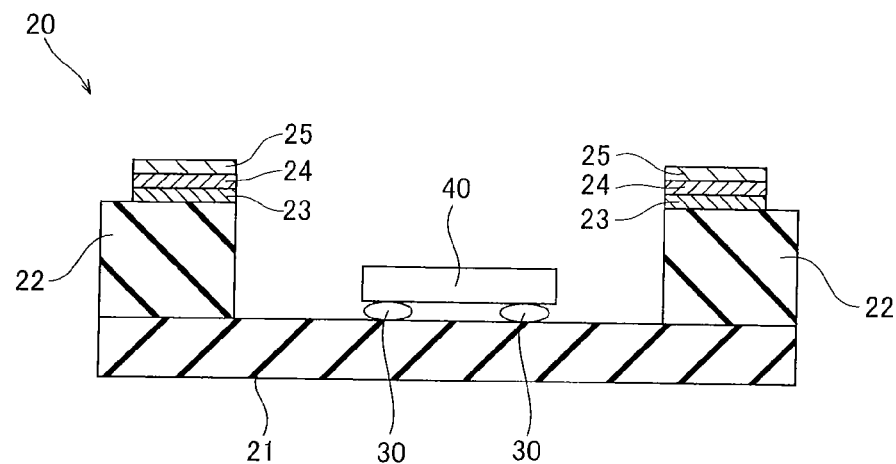
[FIG. 4] A sectional view showing an electronic component housing member sealed with the hermetic sealing cap according to the embodiment of the present invention.

The structure of the electronic component housing member 20 sealed with the hermetic sealing cap 10 shown in FIG. 1 is now described with reference to FIG. 4.

The electronic component housing member 20 includes a ceramic substrate 21 made of an insulating material such as alumina and a ceramic frame body 22, made of an insulating material such as alumina, constituting a housing space on a prescribed region of the surface of the ceramic substrate 21. In the housing space surrounded by the ceramic frame body 22, an electronic component 40 is mounted on the ceramic substrate 21 through bumps 30. A tungsten layer 23, an Ni-based alloy layer 24 having a thickness of about 5 µm and the Au layer 25 having a thickness of about 1 µm are formed on the upper surface of the ceramic frame body 22. This Au layer 25 is formed to be bonded to the solder layer 4 provided on the lower surface of the hermetic sealing cap 10.

Figure 5:
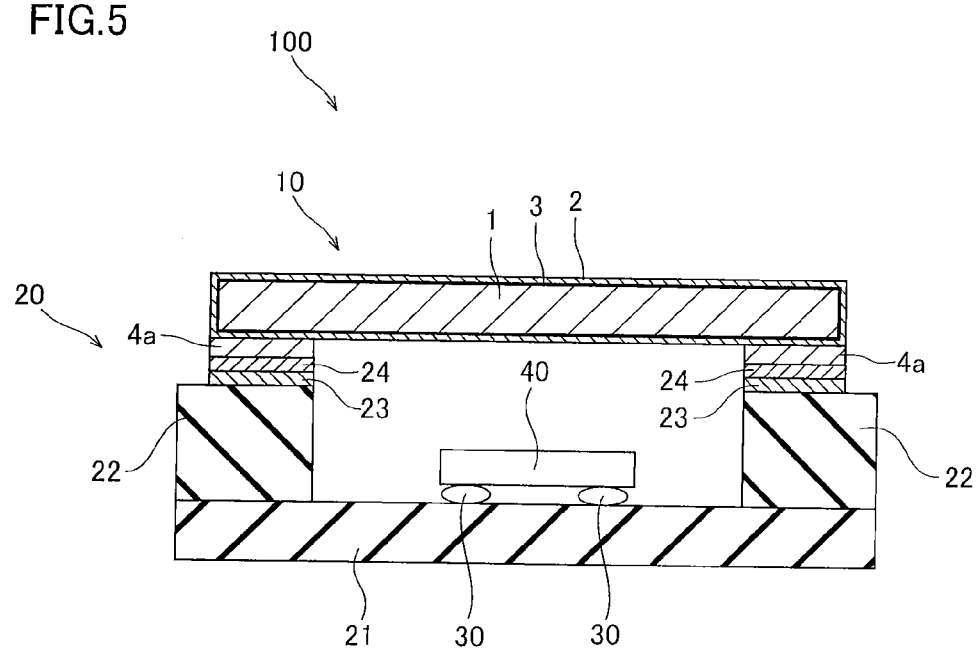
[FIG. 5] A sectional view showing an electronic component housing package consisting of the hermetic sealing cap according to the embodiment of the present invention and the electronic component housing member.

The structure of an electronic component housing package 100 consisting of the hermetic sealing cap 10 according to this embodiment and the electronic component housing member 20 is now described with reference to FIGS. 1, 4 and 5.

The electronic component housing package 100 has such a structure that the electronic component housing member 20 is sealed with the hermetic sealing cap 10 by soldering. The solder layer 4 (see FIG. 1) provided on the hermetic sealing cap 10 is bonded to the Au layer 25 (see FIG. 1) provided on the electronic component housing member 20 and forms a bonding layer 4a in a post-soldering state where the hermetic sealing cap 10 seals the electronic component housing member 20. According to this embodiment, the electronic component housing package 100 nonmagnetic as a whole is constituted of the electronic component housing member 20 made of nonmagnetic ceramics and the nonmagnetic hermetic sealing cap 10 in which the electroless Ni—P plating layer 2 is formed on the cap body portion 1 made of Ti.

According to this embodiment, as hereinabove described, the cap body portion 1 made of Ti is so provided that, since the mechanical strength of Ti is larger than the mechanical strength of ceramics, the thickness of the cap body portion 1 can be reduced as compared with a case of providing a cap body portion mainly composed of ceramics. Consequently, the hermetic sealing cap 10 can be more thinned. When employing the more thinned hermetic sealing cap 10, further, the electronic component housing package 100 can be more thinned. In addition, this hermetic sealing cap 10 is suitable for the electronic component housing package 100 housing an electronic component such as a magnetic sensor easily influenced by magnetism, since the cap body portion 1 is made of nonmagnetic Ti.

According to this embodiment, the nonmagnetic electroless Ni—P plating layer 2 formed to cover the cap body portion 1 is so provided that the hermetic sealing cap 10 substantially nonmagnetic as a whole can be obtained while the cap body portion 1 can be inhibited from corrosion.

According to this embodiment, the electrolytic Ni strike plating layer 3 arranged between the cap body portion 1 and the electroless Ni—P plating layer 2 for increasing the adhesiveness is so provided that the electroless Ni—P plating layer 2 can be easily inhibited from separating from the cap body portion 1, due to the electrolytic Ni strike plating layer 3 excellent in adhesiveness.

According to this embodiment, the electronic component housing package 100 is formed by sealing the electronic component housing member 20 made of alumina with the hermetic sealing cap 10 including the cap body portion 1 made of Ti so that the thermal expansion coefficient (about $7 \times 10^{-6}$/K) of the electronic component housing member 20 and the thermal expansion coefficient (about $9 \times 10^{-6}$/K) of the hermetic sealing cap 10 can be approximated to each other, whereby the electronic component housing member 20 and the hermetic sealing cap 10 can be expanded or contracted with substantially similar rates of changes when the temperature fluctuates. Thus, stress caused in the electronic component housing package 100 can be reduced when the temperature fluctuates, whereby the electronic component housing package 100 can be inhibited from cracking resulting from the stress.

EXAMPLES

Experiments conducted for confirming the performance of the hermetic sealing cap 10 according to the aforementioned embodiment are now described with reference to FIG. 6. In these experiments, evaluation was made as to the adhesiveness between the cap body portion 1 and the electroless Ni—P plating layer 2, influence of magnetism by the electrolytic Ni strike plating layer 3, airtightness of the electronic component housing package 100 and heat resistance of the bonding layer 4a in a case of varying the thickness t3 of the electrolytic Ni strike plating layer 3 of the hermetic sealing cap 10, the thickness t2 of the electroless Ni—P plating layer 2 and the composition as well as the thickness t4 of the solder layer 4 respectively. In order to evaluate these, samples according to Examples 1 to 6 corresponding to this embodiment were prepared.

Samples of Examples 1 to 6

In the sample according to Example 1, an electroless Ni—P plating layer 2 containing P by 12 mass % (the range of dispersion was at least 11 mass % and not more than 13 mass %) was formed on the surface of a cap body portion 1 without providing an electrolytic Ni strike plating layer 3. In each of the samples according to Examples 2 to 6, an electroless Ni—P plating layer 2 containing P by 12 mass % (the range of dispersion was at least 11 mass % and not more than 13 mass %) was formed on the surface of a cap body portion 1 through an electrolytic Ni strike plating layer 3. Each of the samples according to Example 2 and 4 to 6 was so prepared that a target value of the thickness t3 of the electrolytic Ni strike plating layer 3 reached 0.1 µm (the range of dispersion was at least 0.01 µm and not more than 0.3 µm). The sample according to Example 3 was so prepared that a target value of the thickness t3 of the electrolytic Ni strike plating layer 3 reached 0.5 µm (the range of dispersion was at least 0.37 µm and not more than 0.54 µm).

Each of the samples according to Examples 1 to 6 was so prepared that a target value of the thickness t2 of the electroless Ni—P plating layer 2 reached 1.5 µm (the range of dispersion was at least 1.0 µm and not more than 2.0 µm).

In each of the samples according to Examples 1 to 5, a solder layer 4 made of Sn-10Sb containing 10 mass % of Sb was formed. In the sample according to Example 6, a solder layer 4 made of Sn-5Sb containing 5 mass % of Sb was formed.

In each of the samples according to Examples 1 to 3 and 6, a target value of the thickness t4 of the solder layer 4 was set to 75 µm (the range of dispersion was at least 65 µm and not more than 85 µm). In the sample according to Example 4, a target value of the thickness t4 of the solder layer 4 was set to 50 µm (the range of dispersion was at least 40 µm and not more than 60 µm). In the sample according to Example 5, a target value of the thickness t4 of the solder layer 4 was set to 100 µm (the range of dispersion was at least 90 µm and not more than 110 µm). The samples according to Examples 1 to 6 were prepared to be similar to each other as to the structures other than the above.

(Evaluation of Adhesiveness)

Figure 7:
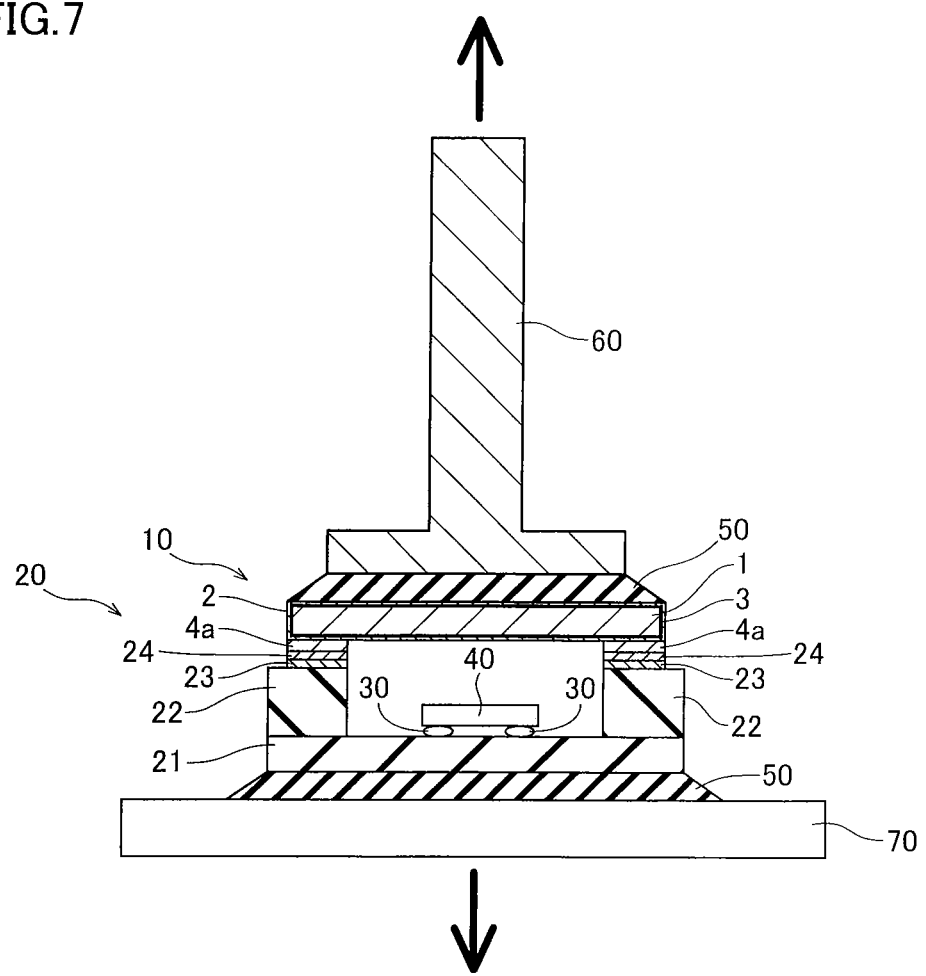
[FIG. 7] A diagram for illustrating a method of evaluating adhesiveness of the hermetic sealing cap according to the embodiment of the present invention.

In this experiment, a nail 60 of stainless in which the outer diameter of a head portion was 3.8 mm and the outer diameter of a body portion was 1.5 mm was mounted on the upper surface of the hermetic sealing cap 100 through an epoxy adhesive 50 and a glass epoxy substrate 70 (NEMA symbol; FR-4) was mounted on the lower surface of the ceramic substrate 21 of the electronic component housing member 20 through an epoxy adhesive 50 in a state where the hermetic sealing cap 10 sealed the electronic component housing member 20, as shown in FIG. 7. Then, adhesiveness was evaluated by working tensile force in the vertical direction on the electronic component housing package 100 through the nail 60 and the glass epoxy substrate 70 thereby measuring adhesive strength of the cap. In this experiment, the adhesiveness was evaluated with ○, Δ and ×, and those having adhesive strength of at least 29 N were evaluated as ○, that having adhesive strength of at least 19 N and less than 29 N was evaluated as Δ, and that in which the adhesive strength was less than 19 N was evaluated as ×.

As shown in FIG. 6, the evaluation of the adhesiveness was ○ in each of the samples according to Examples 2 to 6, while the sample according to Example 1 had the adhesive strength of at least 19 N although the same was less than 29 N, and got the evaluation of Δ. It is conceivable that this is difference resulting from the presence or absence of the electrolytic Ni strike plating layer 3. From this evaluation of the adhesiveness, it is conceivably preferable to provide the electrolytic Ni strike plating layer 3 having the thickness of at least 0.01 µm in order to ensure more excellent adhesiveness, although adhesive strength of at least 19 N can be ensured between the cap body portion 1 and the electroless Ni—P plating layer 2 without providing the electrolytic Ni strike plating layer 3.

(Evaluation of Influence by Magnetism)

In this experiment, evaluation was made with ○, Δ and × as to the magnetism of each hermetic sealing cap 10, and those in which the hermetic sealing caps 10 were nonmagnetic were evaluated as ○, that in which the hermetic sealing cap 10 was substantially nonmagnetic was evaluated as Δ, and that in which the hermetic sealing cap 10 had magnetism was evaluated as ×.

The evaluation of the influence by magnetism was ○ in each of the samples according to Examples 1, 2 and 4 to 6, while the sample according to Example 3 got the evaluation of Δ. This conceivably results from the thickness t3 of the electrolytic Ni strike plating layer 3 having magnetism. More specifically, it is conceivable that, since the target value of the thickness t3 of the electrolytic Ni strike plating layer 3 having magnetism was 0.5 µm (the range of dispersion was at least 0.37 µm and not more than 0.54 µm) in the sample according to Example 3 and larger than the target value 0.1 µm (the range of dispersion was at least 0.01 µm and not more than 0.3 µm) of the thickness t3 of the electrolytic Ni strike plating layer 3 in each of the samples according to Examples 1, 2 and 4 to 6, the influence by magnetism of the electrolytic Ni strike plating layer 3 increased. Therefore, in a case of housing the electronic component 40 such as a magnetic sensor easily influenced by magnetism in the electronic component housing package 100, for example, the electrolytic Ni strike plating layer 3 whose thickness t3 is not more than 0.3 µm is preferably provided.

(Evaluation of Airtightness)

In this experiment, airtightness of each electronic component housing package 100 in which the electronic component housing member 20 was sealed with the hermetic sealing cap 10 was evaluated by conducting a fine leak test testing airtightness of a hermetically sealed miniature electronic component or the like. The airtightness was evaluated with ○, Δ and ×, and each of those exhibiting a rejection rate of 0% with respect to several hundred samples was evaluated as ○, that exhibiting a rejection rate of not more than 2% was evaluated as Δ, and that exhibiting a rejection rate larger than 2% was evaluated as ×.

The evaluation of the airtightness was ○ in each of the samples according to Examples 1 to 3, 5 and 6, and the sample according to Example 4 got the evaluation of Δ. This conceivably results from the thickness t4 of the solder layer 4, and it has been confirmable that the rejection rate is not more than 2% in a case where the thickness t4 is not more than 60 µm while the rejection rate is 0% in a case where the thickness t4 is at least 65 µm. Thus, it is conceivably possible to ensure excellent airtightness when employing the solder layer 4, made of an Sn-based alloy, having the thickness t4 of at least 65 µm.

(Evaluation of Heat Resistance)

In this experiment, each of the samples according to Examples 1 to 6 was heated at 260° C. in a state of sealing the electronic component housing member 20 with the hermetic sealing cap 10, and heat resistance was evaluated on the basis of the melting point of the bonding layer 4a after the sealing. The heat resistance was evaluated with ○, Δ and ×, and each of those exhibiting a rejection rate of 0% with respect to several hundred samples was evaluated as ○, that exhibiting a rejection rate of not more than 1% was evaluated as Δ, and that exhibiting a rejection rate larger than 1% was evaluated as ×.

The evaluation of the heat resistance was ○ in each of the samples according to Examples 1 to 5, and the sample according to Example 6 got the evaluation of Δ. This conceivably results from the composition of the solder layer 4, and it has been confirmable that the rejection rate is not more than 1% in a case of employing a solder layer 4 constituted of Sn-5Sb in which the Sb content is 5 mass % while the rejection rate is 0% in a case of employing a solder layer 4 constituted of Sn-10Sb in which the Sb content is 10 mass %. Thus, it is conceivably possible to ensure excellent heat resistance when employing the solder layer 4 made of an Sn-based alloy containing Sb by 10 mass % in a case where the mounting temperature for the electronic component 40 housed in the electronic component housing package 100 is not more than 260° C.

The embodiment disclosed this time must be considered as illustrative in all points and not restrictive. The range of the present invention is shown not by the above description of the embodiment and Examples but by the scope of claims for patent, and all modifications within the meaning and range equivalent to the scope of claims for patent are included.

For example, while the cap body portion made of Ti has been shown as an example of the cap body portion in the aforementioned embodiment, the present invention is not restricted to this, but the same may be a cap body portion made of a titanium alloy such as 6Al-4V—Ti, for example.

While the electrolytic Ni strike plating layer 3 has been shown as an example of the second plating layer in the aforementioned embodiment, the present invention is not restricted to this, but another plating layer, such as a nonmagnetic Cu strike plating layer, other than the electrolytic Ni strike plating layer may be employed as the second plating layer, for example, so far as the same can increase the adhesiveness between the cap body portion and the first plating layer. In a case of employing the Cu strike plating layer as the second plating layer, the second plating layer also becomes nonmagnetic in addition to the first plating layer, whereby increase in the magnetism can be more suppressed in the hermetic sealing cap as a whole.

While the example of sealing the electronic component housing member with the hermetic sealing cap by soldering has been shown in the aforementioned embodiment, the present invention is not restricted to this, but the electronic component housing member may be sealed with the hermetic sealing cap by brazing, for example, other than the soldering.

While the solder layer made of the Sn-based alloy containing Sb has been shown as an example of the solder layer in the aforementioned embodiment, the present invention is not restricted to this, but the same may be made of an Sn-based alloy containing a component other than Sb.

While it has been shown that the hermetic sealing cap according to the present invention is suitable for the electronic component housing package housing the magnetic sensor in the aforementioned embodiment, the present invention is not restricted to this, but the hermetic sealing cap according to the present invention is also suitable for an electronic component housing package housing an electronic component, such as a quartz resonator, a SAW filter or an acceleration sensor, other than the magnetic sensor.

The invention claimed is:

1. A hermetic sealing cap, employed for an electronic component housing package (100) housing an electronic component, comprising:
    a cap body portion mainly composed of Ti;
    a nonmagnetic first plating layer provided to cover a periphery of said cap body portion; and
    a second plating layer arranged between said cap body portion and said first plating layer for increasing adhesiveness, wherein said second plating layer has magnetism and has a thickness smaller than a thickness of said nonmagnetic first plating layer.

2. The hermetic sealing cap according to claim 1, wherein said first plating layer is an Ni-based plating layer containing P, and
    the content of P in said Ni-based plating layer is at least 8 mass % and not more than 20 mass %.

3. The hermetic sealing cap according to claim 2, wherein the content of P in said Ni-based plating layer is at least 8 mass % and not more than 15 mass %.

4. The hermetic sealing cap according to claim 3, wherein the content of P in said Ni-based plating layer is at least 11 mass % and not more than 13 mass %.

5. The hermetic sealing cap according to claim 1, wherein said first plating layer has a thickness of at least 1 μm and not more than 2 μm.

6. The hermetic sealing cap according to claim 1, wherein said first plating layer is an electroless Ni-based plating layer.

7. The hermetic sealing cap according to claim 6, wherein said first plating layer is an electroless Ni—P plating layer.

8. The hermetic sealing cap according to claim 1, wherein said second plating layer is an Ni-based strike plating layer.

9. The hermetic sealing cap according to claim 1, wherein said second plating layer has a thickness of at least 0.01 μm and not more than 0.3 μm.

10. The hermetic sealing cap according to claim 1, wherein said second plating layer is an electrolytic N-based strike plating layer.

11. The hermetic sealing cap according to claim 1, mounted on an electronic component housing member for housing said electronic component with a solder layer mainly composed of an Sn-based alloy.

12. The hermetic sealing cap according to claim 11, wherein
    said solder layer in a state before said hermetic sealing cap is mounted on said electronic component housing member has a thickness of at least 65 μm.

13. The hermetic sealing cap according to claim 12, wherein
    said solder layer in the state before said hermetic sealing cap is mounted on said electronic component housing member has a thickness of at least 65 μm. and not more than 110 μm.

14. The hermetic sealing cap according to claim 11, wherein
    said solder layer mainly composed of the Sn-based alloy contains at least 5 mass % and not more than 10 mass % of Sb.

15. The hermetic sealing cap according to claim 1, mounted on an electronic component housing member made of ceramics for housing said electronic component.

* * * * *